(12) United States Patent
Harada et al.

(10) Patent No.: US 8,952,391 B2
(45) Date of Patent: Feb. 10, 2015

(54) SILICON CARBIDE SEMICONDUCTOR DEVICE AND ITS MANUFACTURING METHOD

(75) Inventors: Shinsuke Harada, Ibaraki (JP); Tsutomu Yatsuo, Ibaraki (JP); Kenji Fukuda, Ibaraki (JP); Mitsuo Okamoto, Ibaraki (JP); Kazuhiro Adachi, Ibaraki (JP); Seiji Suzuki, Osaka (JP)

(73) Assignees: National Institute of Advanced Industrial Science and Technology, Tokyo (JP); Sanyo Electric Co., Ltd., Moriguchi-shi (JP)

( * ) Notice: Subject to any disclaimer, the term of this patent is extended or adjusted under 35 U.S.C. 154(b) by 693 days.

(21) Appl. No.: 10/531,582

(22) PCT Filed: Oct. 3, 2003

(86) PCT No.: PCT/JP03/12727
§ 371 (c)(1),
(2), (4) Date: Oct. 12, 2005

(87) PCT Pub. No.: WO2004/036655
PCT Pub. Date: Apr. 29, 2004

(65) Prior Publication Data
US 2006/0057796 A1    Mar. 16, 2006

(30) Foreign Application Priority Data
Oct. 18, 2002    (JP) ................................ 2002-304596

(51) Int. Cl.
*H01L 29/15*    (2006.01)
*H01L 29/66*    (2006.01)
(Continued)

(52) U.S. Cl.
CPC ...... *H01L 29/66477* (2013.01); *H01L 21/0465* (2013.01); *H01L 29/66068* (2013.01);
(Continued)

(58) Field of Classification Search
CPC ................. H01L 21/02529; H01L 21/823487; H01L 21/823885; H01L 29/1608; H01L 29/7802
USPC .............. 257/77, E21.054, E21.056, E21.057
See application file for complete search history.

(56) References Cited

U.S. PATENT DOCUMENTS 5,893,736 A * 4/1999 Lee et al. ....................... 438/271
5,895,939 A * 4/1999 Ueno ............................. 257/279
(Continued)

FOREIGN PATENT DOCUMENTS

EP    1 143 526    10/2001
JP    61-013667    1/1986
(Continued)

OTHER PUBLICATIONS

U.S. Appl. No. 11/718,036, filed Apr. 26, 2007, Yatsuo, et al.
(Continued)

*Primary Examiner* — Jay C Kim
(74) *Attorney, Agent, or Firm* — Oblon, Spivak, McClelland, Maier & Neustadt, L.L.P.

(57) ABSTRACT

A silicon carbide vertical MOSFET having low ON-resistance and high blocking voltage. A first deposition film of low concentration silicon carbide of a first conductivity type is formed on the surface of a high concentration silicon carbide substrate of a first conductivity type. Formed on the first deposition film is a second deposition film that includes a high concentration gate region of a second conductivity type, with a first region removed selectively. A third deposition film is formed on the second deposition film, which includes a second region that is wider than the selectively removed first region, a high concentration source region of a first conductivity type, and a low concentration gate region of a second conductivity type. A low concentration base region of a first conductivity type is formed in contact with the first deposition film in the first and second regions.

8 Claims, 17 Drawing Sheets

(51) Int. Cl.
*H01L 21/04* (2006.01)
*H01L 29/78* (2006.01)
*H01L 21/02* (2006.01)
*H01L 29/10* (2006.01)
*H01L 29/16* (2006.01)
*H01L 29/423* (2006.01)

(52) U.S. Cl.
CPC ...... *H01L29/7802* (2013.01); *H01L 21/02529* (2013.01); *H01L 29/1095* (2013.01); *H01L 29/1608* (2013.01); *H01L 29/42368* (2013.01)
USPC .............. 257/77; 257/E21.054; 257/E21.056; 257/E21.057

(56) References Cited

U.S. PATENT DOCUMENTS

| | | | |
|---|---|---|---|
| 6,054,352 A | 4/2000 | Ueno | |
| 6,096,607 A | 8/2000 | Ueno | |
| 6,165,822 A * | 12/2000 | Okuno et al. | 438/142 |
| 6,429,041 B1 | 8/2002 | Ryu et al. | |
| 6,455,892 B1 * | 9/2002 | Okuno et al. | 257/328 |
| 2002/0047125 A1 * | 4/2002 | Fukuda et al. | 257/77 |

FOREIGN PATENT DOCUMENTS

| | | |
|---|---|---|
| JP | 1-144683 | 6/1989 |
| JP | 2-216871 | 8/1990 |
| JP | 5-259443 | 10/1993 |
| JP | 2000-082812 | 3/2000 |
| JP | 2000-150875 | 5/2000 |
| JP | 2001-119025 | 4/2001 |

OTHER PUBLICATIONS

Capano, M.A. et al. "Ionization energies and electron mobilities in phosphorus- and nitrogen-implanted 4H-silicon carbide", Journal of Applied Physics, vol. 87, No. 12, pp. 8773-8777 2000.

Harada, Shinsuke et al. "High Channel Mobility in Normally-Off 4H-SiC Buried Channel MOSFETs", IEEE Electron Device Letters, vol. 22, No. 6, pp. 272-274 2001.

* cited by examiner

F I G. 7
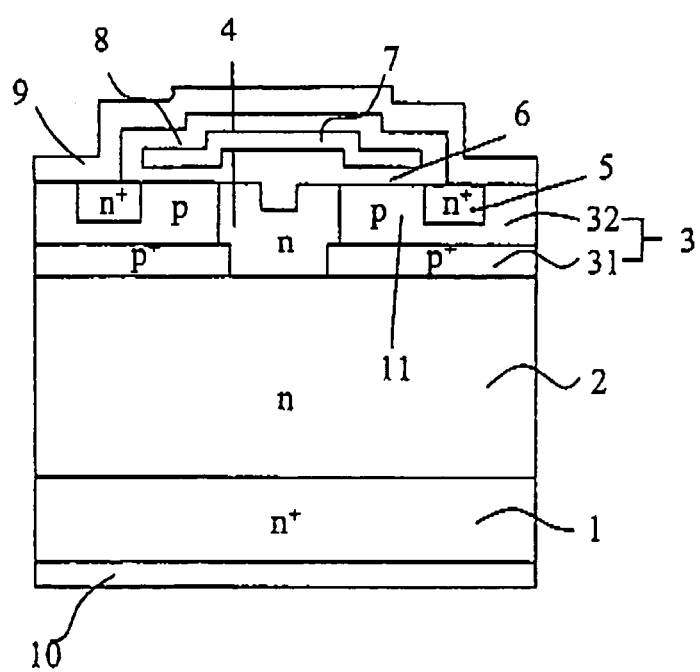

F I G. 9
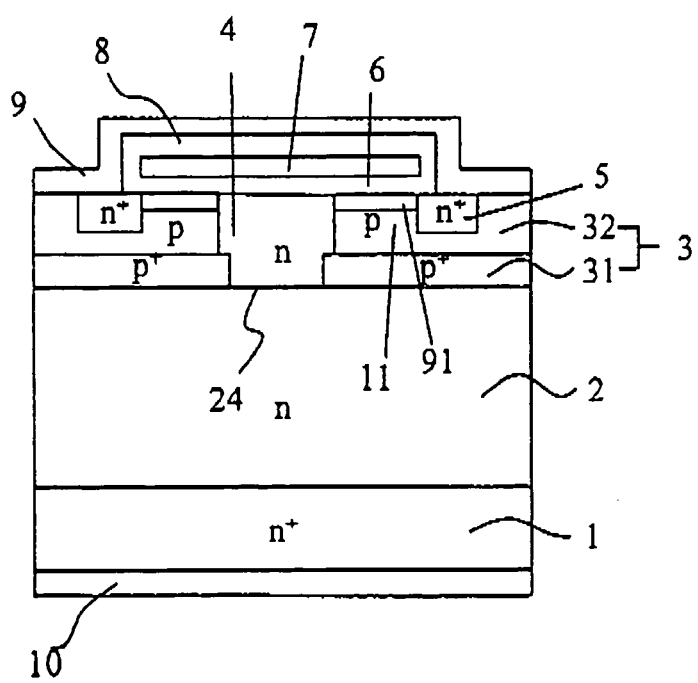

F I G. 10
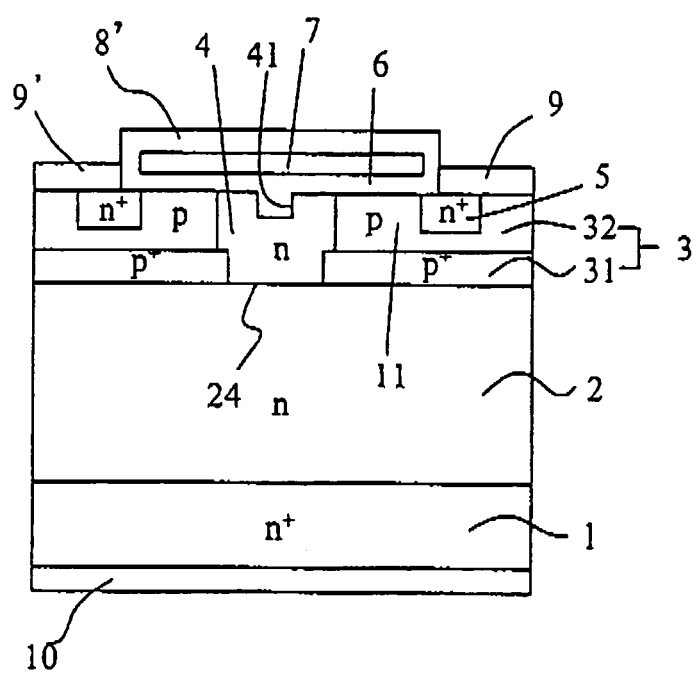

F I G. 12
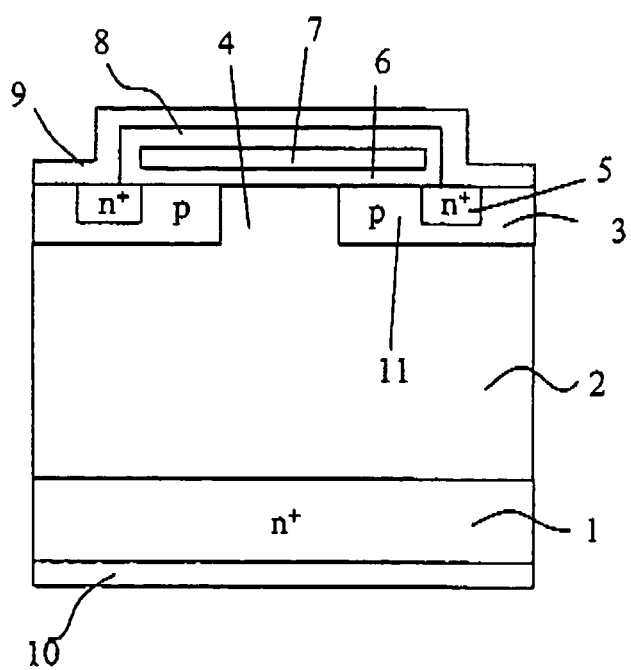

SILICON CARBIDE SEMICONDUCTOR DEVICE AND ITS MANUFACTURING METHOD

TECHNICAL FIELD

The present invention relates to a vertical MOSFET device manufactured on a silicon carbide substrate, and to a method of manufacturing same.

BACKGROUND ART

Compared with silicon (Si), silicon carbide (SiC) has a number of superior properties, such as 1. a wider bandgap, 2. a higher dielectric breakdown strength and 3. a higher electron saturation drift velocity. As such, using silicon carbide as a substrate material makes it possible to manufacture low-resistance power semiconductor devices having much higher blocking voltages than silicon has. Also, as in the case of silicon, thermal oxidation can be used to form an insulation layer on silicon carbide. For this reason, considerable research and development is being conducted into producing vertical MOSFETs having a low ON-resistance and high blocking voltages, using silicon carbide as the substrate material.

FIG. 12 is a schematic cross-sectional view for explaining a unit cell of a typical planar vertical MOSFET. In FIG. 12, a low concentration n-type drift layer 2 is deposited on a high concentration n$^+$ substrate 1. In the low concentration n-type drift layer 2, a p-type well layer 3 is selectively formed from the surface. There is a low concentration n-type base region 4 between the well layers 3.

A high concentration n$^+$ source region 5 is also selectively formed in the p-type well layer 3 from the surface. A gate insulation film 6 is formed on the surface of the low concentration n-type base region 4 and on the surface of the portion of the p-type well layer flanked by the high concentration n$^+$ source region 5, and a gate electrode 7 is provided on the gate insulation film 6. An interlayer insulation film 8 is formed on the gate electrode 7, and a source electrode 9 is formed on the interlayer insulation film 8 and has a low-resistance connection with a portion of the surface of the high concentration nt source region 5 and with a portion of the surface of the p-type well layer 3.

A drain electrode 10 is formed on the backside of the high concentration n$^+$ substrate 1. When a gate voltage that is a threshold voltage or higher is applied to the gate electrode 7 of the planar vertical MOSFET having this structure, electrons are induced to the surface of the p-type well layer 3, forming an n-type inversion layer in the surface layer of a channel region 11. Tis produces a state of electrical continuity between the high concentration n$^+$ source region 5 and the low concentration n-type drift layer 2, enabling an electric current to flow from the drain electrode 10 to the source electrode 9.

When the gate voltage is lower than the threshold voltage, the high concentration n$^+$ source region 5 and the low concentration n-type drift layer 2 enter an insulated state. When a voltage is applied to the drain electrode 10 in this state, the low concentration n-type base region 4 is pinched off by a depletion layer that extends from the junction between the p-type well layer 3 and the low concentration n-type base region 4. If the voltage to the drain electrode 10 is increased, the depletion layer extends to within the low concentration n-type drift layer 2. The maximum applied voltage is limited by the thickness of the low concentration n-type drift layer 2, determining the blocking voltage of the device.

When the substrate material is silicon, the planar type vertical MOSFET is manufactured by the double diffusion method. FIGS. 13(a) to 13(f) and FIGS. 14(a) and 14(b) are views for explaining the method of manufacturing a planar type vertical MOSFET by the double diffusion method. First, a low concentration n-type drift layer 2 is deposited on the surface of a high concentration n$^+$ substrate 1. Then, oxidation is used to form a gate insulation film 6 on the surface of the low concentration n-type drift layer 2.

Polycrystal silicon 7a is deposited on the gate insulation film 6, producing the state shown in FIG. 13(a). Photolithography is then used to pattern-process the polycrystal silicon 7a to form gate electrode 7, as shown in FIG. 13(b). Next, as shown in FIG. 13(c), selective p-type impurity ion implantation 3a is carried out, using the gate electrode 7 as a mask.

Thermal diffusion is then used to form a p-type well layer 3, as shown in FIG. 13(d). A p-type impurity such as boron or the like that has a high diffusion coefficient will penetrate under the mask. Then, as shown in FIG. 13(e), ion implantation 5a of an n-type impurity such as phosphorus is carried out, using the same mask. Thermal diffusion is then used to form the high concentration n$^+$ source region 5, shown in FIG. 13(f).

An n-type impurity such as phosphorus has a smaller diffusion coefficient than a p-type impurity such as boron, so a channel region 11 is formed by the difference in diffusion length in the horizontal direction, as shown in FIG. 14(a). Next, the CVD method is used to form interlayer insulation film 8 on the surface, and a window is formed in the interlayer insulation film 8. As shown in FIG. 14(b), source electrode 9 is then provided on the surfaces of the high concentration n$^+$ source region 5 and the p-type well layer 3 with a low-resistance contact connection.

In this planar type vertical MOSFET using silicon, manufactured using double diffusion, to ensure that conduction electrons in the channel that are induced to the surface layer of the channel region 11 are not scattered by crystal defects and the like caused by ion implantation and the like, they are given a high channel mobility of several hundred cm$^2$/Vs, which provides low ion resistance.

In contrast, when a silicon carbide substrate (high concentration n$^+$ substrate) 1 is used, the planar type vertical MOSFET having the structure shown in FIG. 12 cannot be manufactured using the double diffusion method illustrated by FIGS. 13 and 14. This is because inside the silicon carbide substrate (low concentration n-type drift layer) 2, the diffusion coefficient of the impurity elements is very small, so the channel region 11 cannot be formed by the difference in the horizontal diffusion lengths of the p-type and n-type impurities.

Generally, a silicon carbide planar type vertical MOSFET is manufactured by the double ion implantation method, described below. FIGS. 15(a) to 15(f) and FIGS. 16(a) and 16(b) illustrate the method of manufacturing a typical planar type vertical MOSFET using the conventional double ion implantation method. With reference to FIG. 15(a), first, a low concentration n-type drift layer 2 is formed on a silicon carbide n$^+$ substrate (high concentration n$^+$ substrate) 1. As shown in FIG. 15(b), a mask 12 is provided on the surface of the low concentration n-type drift layer 2.

By means of the mask 12, the low concentration n-type drift layer 2 is subjected to selective implantation of p-type impurity ions 3a. If the implantation acceleration voltage is raised at this time, the p-type impurity ion implantation 3a penetrates deep into the low concentration n-type drift layer 2. Next, as shown in FIG. 15(c), the low concentration n-type drift layer 2 is provided with different-size masks 13, which are used for selective implanting of n-type impurity ions 5a.

The acceleration voltage at this time is set to one at which the range distance of the n-type impurity ions 5a is smaller than that of the p-type impurity ions 3a. As shown in FIG. 15(d), when the masks 13 have been removed, heat treatment is used to activate the implanted-ion region and form high concentration n+ source region 5 and p-type well layer 3. As the diffusion of the implanted ions by the heat treatment is very low, the profile of the implanted ions remains substantially the same for each layer.

Following this, thermal oxidation is used to form a gate insulation film 6 on the surface, as shown in FIG. 15(e). Also, polycrystal silicon or metal 7a is deposited on the gate insulation film 6. Photolithography is used to form gate electrode 7 from the polycrystal silicon or metal 7a, as shown in FIG. 15(f). Next, the CVD method is used to form interlayer insulation film 8 on the surface of the gate electrode 7, and a window is formed in the interlayer insulation film 8, as shown in FIG. 16(a). As shown in FIG. 16(b), source electrode 9 is then provided on the surfaces of the high concentration n+ source region 5 and p-type well layer 3 with a low-resistance contact connection.

Since with this method the channel region 11 is formed by ion implantation, it includes many crystal defects arising from the ion implantation. Also, the implanted p-type impurity elements are not adequately electrically activated even by applying heat treatment at high temperatures above 1600° C. Therefore, in order to obtain a sufficient impurity concentration, it is necessary to increase the injection amount, which increases the amount of defects that are produced.

As a result, the conduction electrons in the channel are scattered by these defects and the like, reducing mobility. Thus, a problem with silicon carbide planar type vertical MOSFETs manufactured by the double ion implantation method is that channel mobility is 1 cm$^2$/Vs or lower, which is very low, and the ON-resistance is far higher than the theoretical level.

Ways of reducing the ON-resistance of silicon carbide planar MOSFETs include forming the channel region 11 by deposition rather than ion implantation, as described in the Journal of Applied Physics, vol. 87, 8773 (2000). FIG. 17 is a cross-sectional schematic view for explaining the unit cell structure of such a MOSFET. In the MOSFET of FIG. 17, a low concentration n-type drift layer 2 is deposited on a high concentration n+ substrate 1, a high concentration p+ layer 31 is deposited on the drift layer 2, and a low concentration p-type layer 32 is selectively deposited on the layer 31. Then, implantation of n-type impurity ions is used to selectively form a low concentration n-type base region 4 that extends through the high concentration p+ layer 31 and low concentration p-type layer 32 to the low concentration n-type drift layer 2. A high concentration n+ source region 5 is then selectively formed on the surface of the low concentration p-type layer 32.

The portions of the high concentration p+ layer 31 and the low concentration p-type layer 32 that are not thus implanted with n-type impurity ions form p-type well layer 3. Since in the case of this structure the channel region 11 is formed in a deposition film in which ions have not been implanted, conduction electrons having a high mobility can be obtained. Here, the p-type layer 32 is given a relatively low concentration in order to obtain high channel mobility.

There is a published report (IEEE Electron Device Letters, vol. 22, 272 (2001)) of high channel mobility being obtained in an actual silicon carbide planar type vertical MOSFET fabricated on a 5×10$^{15}$ cm$^{-3}$ low concentration p-type deposition film. It is necessary for the p+ layer 31 to have a relatively high concentration, because if it has a low concentration its thickness has to be increased to one in the order of several microns to prevent punch-through at low voltages between the high concentration n+ source region 5 and the low concentration n-type drift layer 2. Doing that means that the acceleration voltage for the implantation of n-type impurity ions for forming the low concentration n-type base region 4 becomes very high, in the MeV range, making it difficult to manufacture an apparatus using an ordinary apparatus. It can be considered that punch-through can be prevented and the structure made able to have high blocking voltages by making the concentration of the p-type layer 31 relatively high and reducing the thickness of the layer. The above cited references that put forward this structure contain no details relating to the manufacturing procedure.

A possible manufacturing method could involve depositing the high concentration p+ layer 31 on the low concentration n-type drift layer 2, and depositing the low concentration p-type layer 32 on the layer 31. This would be followed by using a mask for selective implantation of n-type impurity ions, and heat treatment, to reverse the layer polarity from p-type to n-type and thereby form the low concentration n-type base region 4 bounded by the p-type well layer 3.

Since in this method the channel region 11 is formed by a low concentration p-type deposition film, it should provide a high channel mobility and low ON-resistance. However, increasing the blocking voltage is difficult, for the following reason. The portion 24 where the low concentration n-type base region 4 contacts the low concentration n-type drift layer 2 is a region formed by the implantation of n-type impurity ions in a high concentration p-type deposition film.

In this case, since it is technologically impossible for ion implantation to change a high concentration p-type layer to a p-type layer having a relatively lower concentration, the impurity concentration of the low concentration n-type base region 4 has to be made higher than that of the high concentration p+ layer 31. As a result, the blocking voltage of the pn junction between the low concentration n-type base region 4 formed by the ion implantation and the high concentration p+ layer 31 becomes very low.

When a positive drain voltage is imposed in the voltage suppression state, it is necessary to use a depletion layer to perform full pinch-off by applying a reverse bias to the pn junction between the low concentration n-type base region 4 and the high concentration p+ layer 31. However, when the pn junction has a low blocking voltage, suppression capability is lost at the low voltage level, before pinch-off. When the n-type base region 4 is a high concentration region, there is little spread of the depletion layer so an even higher reverse bias has to be applied to achieve full pinch-off, so the higher voltage makes it even more difficult to suppress the voltage. For the above reasons, this structure is not suitable for obtaining silicon carbide planar type vertical MOSFETs having high blocking voltages.

Since silicon carbide planar type vertical MOSFETs manufactured using double ion implantation includes many crystal defects caused in the channel region by the ion implantation, channel mobility is low and the ON-resistance is not decreased. In contrast, the method in which the channel region is formed of low concentration p-type deposition film increases the channel mobility, and as such can be expected to decrease the ON-resistance. However, since in the structure of silicon carbide planar type vertical MOSFETs proposed up until now, the entire surface of the n-type drift layer is covered by a high concentration p-type deposition film, high concentration n-type impurity ions have to be implanted to form the low concentration n-type base region. This gives rise to the problem that the concentration of the base region is increased, making it impossible to maintain high voltage-suppression capability.

In order to resolve these problems, an object of the present invention is to realize a silicon carbide vertical MOSFET having low ON-resistance and high blocking voltage, by providing in a silicon carbide vertical MOSFET having a gate region a silicon carbide semiconductor apparatus having a low concentration base region for increased blocking voltage (with respect to terminology for characterizing the semiconductor layer impurity concentration or structure and so forth, in terms of function, it is more suitable to describe it as a "gate region," which has a broader meaning than "channel region," since the channel region formed by the low concentration p-type deposition film on the surface of the semiconductor layer by gate signals, is very thin, being 0.01 µm thick or thinner, so the semiconductor layer that forms the channel region is much larger than the channel region; so hereinafter "gate region" will be used instead of "channel region").

Another object of the invention is also to provide a method of manufacturing the silicon carbide semiconductor apparatus with a high blocking voltage having a gate region formed from low concentration p-type deposition film.

A further object of the invention is to provide a silicon carbide semiconductor apparatus having a gate insulation film and gate electrode structure for reducing ON-resistance in a silicon carbide vertical MOSFET with high blocking voltage having a gate region formed from low concentration p-type deposition film.

A further object of the invention is to provide a silicon carbide semiconductor apparatus having a substrate plane orientation for reducing ON-resistance in a silicon carbide vertical MOSFET with high blocking voltage having a gate region formed from low concentration p-type deposition film.

DISCLOSURE OF THE INVENTION

The present invention provides a silicon carbide semiconductor apparatus, comprising a first deposition film of low concentration silicon carbide of a first conductivity type formed on a surface of a high concentration silicon carbide substrate of a first conductivity type, a second deposition film formed on the first deposition film comprising a high concentration gate region of a second conductivity type having a selectively removed first region, a third deposition film formed on the second deposition film comprising a second region that is wider than the selectively removed first region, a high concentration source region of a first conductivity type and a low concentration gate region of a second conductivity type, a low concentration base region of a first conductivity type formed in contact with the first deposition film in the first and second regions, a gate insulation film formed on at least a surface of the third deposition film, a gate electrode formed via the gate insulation film, a drain electrode having a low-resistance contact connection with a backside of the silicon carbide substrate of a first conductivity type, and a source electrode having a low-resistance contact connection with part of the high concentration source region of a first conductivity type and the low concentration gate region of a second conductivity type.

In the above apparatus, the third deposition film has a thickness within a range of 0.2 µm to 0.7 µm, and the low concentration gate region of a second conductivity type selectively formed in the third deposition film has a portion that is in contact with the gate insulation film and has an impurity concentration higher than $1 \times 10^{15}$ cm$^{-3}$ and lower than $5 \times 10^{15}$ cm$^{-3}$.

In the above apparatus, also, the low concentration base region of a first conductivity type has an upper surface having at least a portion thereof in contact with the gate insulation film and provided therein with a cavity.

Also in the above apparatus, the low concentration base region of a first conductivity type has a lower impurity concentration than the high concentration gate region of the second conductivity type.

In the apparatus, the low concentration gate region of the second conductivity type selectively formed in the third deposition film has a portion that is in contact with the gate insulation film and has an impurity concentration of not higher than $2 \times 10^{16}$ cm$^{-3}$.

Also, the low concentration base region of the first conductivity type selectively formed in the third deposition film has a portion that is in contact with the high concentration gate region of the second conductivity type and has an impurity concentration of not higher than $4 \times 10^{16}$ cm$^{-3}$.

In the apparatus, also, the high concentration gate region of a second conductivity type is the second deposition film of silicon carbide formed on the first deposition film.

Also, the gate insulation film formed on the third deposition film has at least a portion thicker than other portions on the low concentration base region of the first conductivity type selectively formed in the third deposition film.

Also, above a surface of the base region of a first conductivity type selectively formed in the third deposition film, the gate electrode has at least a portion removed.

In the apparatus, also, in terms of crystal Miller index the surface of the silicon carbide substrate of the first conductivity type is a plane that is parallel to a (11-20) plane, or a plane that is parallel to a (000-1) plane.

Also, the low concentration gate region of a second conductivity type has a portion that is in contact with the gate insulation film and has a buried channel region of a first conductivity type.

The invention further provides a silicon carbide semiconductor apparatus comprising a lower deposition film of low concentration silicon carbide of a first conductivity type formed on a surface of a high concentration silicon carbide substrate of a first conductivity type, a high concentration gate region of a second conductivity type selectively formed in the lower deposition film so that a first region of low concentration silicon carbide of a first conductivity type remains in the lower deposition film, an upper deposition film on the lower deposition film, comprising a low concentration base region of a first conductivity type that is a second region wider than the first region, a high concentration source region of a first conductivity type and a low concentration gate region of a second conductivity type, a gate insulation film formed on at least a surface of the upper deposition film, a gate electrode formed via the gate insulation film, a drain electrode having a low-resistance contact connection with a backside of the silicon carbide substrate of a first conductivity type, and a source electrode having a low-resistance contact connection with part of the high concentration type source region of a first conductivity and the low concentration gate region of a second conductivity type.

In the above apparatus, the upper deposition film has a thickness within a range of 0.2 µm to 0.7 µm, and the low concentration gate region of a second conductivity type selectively formed in the upper deposition film has a portion that is in contact with the gate insulation film and has an impurity concentration higher than $1\times10^{15}$ cm$^{-3}$ and lower than $5\times10^{15}$ cm$^{-3}$.

In the above apparatus, also, the low concentration base region of the first conductivity type has a lower impurity concentration than the high concentration gate region of the second conductivity type.

And, the low concentration gate region of the second conductivity type selectively formed in the upper deposition film has a portion that is in contact with the gate insulation film and has an impurity concentration of not higher than $2\times10^{16}$ cm$^{-3}$, and the upper deposition film is constituted of silicon carbide.

In addition, the gate insulation film formed on the upper deposition film has at least a portion that is thicker than other portions on the low concentration base region of the first conductivity type selectively formed in the upper deposition film, and on the surface of the base region of the first conductivity type selectively formed in the upper deposition film, the gate electrode has at least a portion removed.

In the above apparatus, also, in terms of crystal Miller index the surface of the silicon carbide substrate of the first conductivity type is a plane that is parallel to a (11-20) or (000-1) plane. Also, the low concentration gate region of a second conductivity type has a portion that is in contact with the gate insulation film and has a buried channel region of a first conductivity type.

The invention also provides a method of manufacturing a silicon carbide semiconductor apparatus, comprising at least the steps of forming a first deposition film of low concentration silicon carbide of a first conductivity type on a surface of a high concentration silicon carbide substrate of a first conductivity type, forming on the first deposition film a second deposition film having a first region from which a high concentration region of a second conductivity type has been selectively removed, forming on the second deposition film and on the selectively removed first region a third deposition film comprised of a low concentration region of a second conductivity type, selectively forming a second region in the third deposition film that is wider than the first region by forming a low concentration base region of a first conductivity type in the first and second regions in contact with the first deposition film of low concentration silicon carbide of a first conductivity type and selectively forming a source region constituted of a high concentration of silicon carbide of a first conductivity type in the third deposition film, forming a gate insulation film on at least the surface of the third deposition film, forming a gate electrode via the gate insulation film, forming a drain electrode having a low-resistance contact connection on a backside of the silicon carbide substrate of a first conductivity type, and forming a source electrode having a low-resistance contact connection with part of the high concentration source region of a first conductivity type and the low concentration gate region of a second conductivity type.

The above method also comprises the steps of forming the second deposition film on the first deposition film, forming a trench that extends from the surface of the second deposition film to the first deposition film, forming the third deposition film on the second deposition film and the trench, and selectively implanting impurity ions of a first conductivity type to form the low concentration base region of a first conductivity type in the third deposition film.

The invention also provides a method of manufacturing a silicon carbide semiconductor apparatus, comprising at least the steps of forming a lower deposition film of low concentration silicon carbide of a first conductivity type on a surface of a silicon carbide substrate of a first conductivity type, forming an impurity region of a second conductivity type in the lower deposition film, forming an upper deposition film constituting a low concentration gate region of a second conductivity type on the lower deposition film on which the impurity region of a second conductivity type is formed, forming a high concentration source region of a first conductivity type on the upper deposition film, forming in the upper deposition film a low concentration base region of a first conductivity type in contact with the lower deposition film, forming a gate insulation film on at least a surface of the upper deposition film, forming a gate electrode via the gate insulation film, forming a drain electrode having a low-resistance contact connection with a backside of the silicon carbide substrate of a first conductivity type, and forming a source electrode having a low-resistance contact connection with part of the high concentration source region of a first conductivity type and the low concentration gate region of a second conductivity type.

The above method also comprises the steps of forming the impurity region of a second conductivity type in the lower deposition film of low concentration silicon carbide by implantation of a high concentration of impurity ions of a second conductivity type, and forming the upper deposition film thereon, and selectively implanting impurity ions of a first conductivity type in the upper deposition film to form the low concentration base region of a first conductivity type.

As a means of imparting high blocking voltage to the silicon carbide vertical MOSFET having a low concentration channel region formed in a low concentration p-type deposition film, the present invention provides a structure comprising a high concentration p$^+$ deposition film between the low concentration p-type deposition film and an n-type drift layer, wherein the high concentration p$^+$ deposition film has a removed first region, in which first region there is an n-type base region having a relatively low concentration in contact with part of the n-type drift layer.

A second region provided in a low concentration p-type deposition film is wider than the first region provided in the high concentration p$^+$ deposition film, reducing the resistance components from that portion, thereby lowering the ON-resistance. When the gate insulation film over the n-type base region is made thicker than the low concentration gate region and a positive gate voltage is applied, there is a decrease in the number of conduction electrons in the vicinity of the interface between the gate insulation film and the n-type base region, making it possible to lower the ON-resistance without increasing the resistance in the interface vicinity. Using a substrate surface that is parallel to the (11-20) or (000-1) plane decreases the interface state density between the gate insulation film and the gate region is reduced, also enabling a lower ON-resistance without increasing the resistance in the interface vicinity.

Further features of the invention, its nature and various advantages will be more apparent from the accompanying drawings and following detailed description of the invention.

BRIEF DESCRIPTION OF THE DRAWINGS

FIG. 7 is a schematic cross-sectional drawing for explaining a silicon carbide vertical MOSFET that is a third embodiment of the invention.

FIG. 9 is a schematic cross-sectional drawing for explaining a silicon carbide vertical MOSFET that is a fifth embodiment of the invention.

FIG. 10 is a schematic cross-sectional drawing for explaining a silicon carbide vertical MOSFET that is a sixth embodiment of the invention.

FIG. 12 is a schematic cross-sectional drawing for explaining a unit cell of a typical planar type vertical MOSFET.

BEST MODE FOR CARING OUT THE INVENTION

Details of the present invention will now be explained with reference to the drawings.

Figure 1:
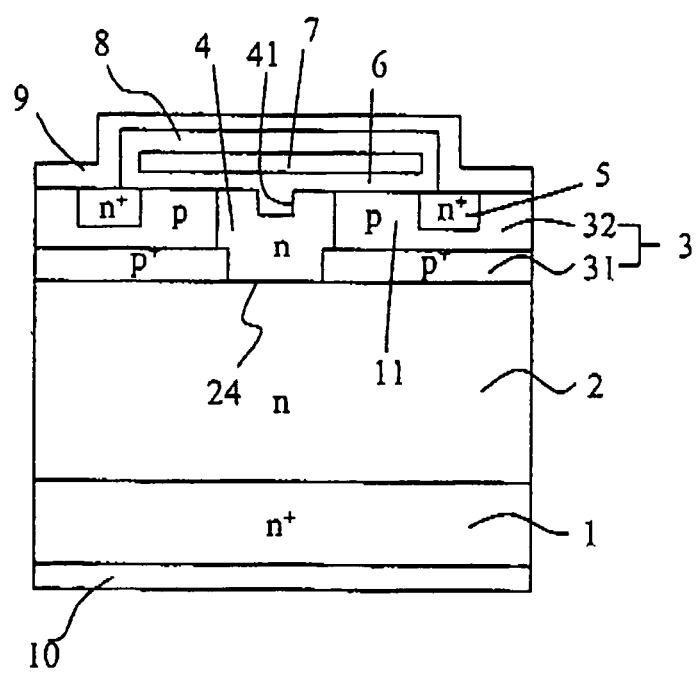
FIG. 1 is a schematic cross-sectional drawing for explaining a unit cell of a silicon carbide vertical MOSFET that is a first embodiment of the invention.

FIG. 1 is a schematic cross-sectional drawing for explaining a unit cell of a silicon carbide vertical MOSFET according to a first embodiment of the invention. In FIG. 1, a low concentration n-type drift layer 2 having a thickness of 10 μm and a nitrogen doping concentration of $5 \times 10^{15}$ cm$^{-3}$, for example, is deposited on the surface of a high concentration n$^+$ substrate 1 having a (0001) surface, a thickness of 300 μm and a nitrogen doping concentration of $1 \times 10^{18}$ cm$^{-3}$, for example.

A high concentration p$^+$ layer 31 having a thickness of 0.5 μm and an aluminum doping concentration of $2 \times 10^{18}$ cm$^{-3}$, for example, is formed on the low concentration n-type drift layer 2. Then, a low concentration p-type layer 32 having a thickness of 0.5 μm and an aluminum doping concentration of $5 \times 10^{15}$ cm$^{-3}$, for example, is formed on the high concentration p$^+$ layer 31. A high concentration n$^+$ source region 5 that is selectively doped with about a $1 \times 10^{20}$ cm$^{-3}$ concentration of phosphorus is formed in a surface portion of the low concentration p-type layer 32. A first region comprising a gap 2 μm wide is selectively formed in the high concentration p$^+$ layer 31, and a second region that is wider than that gap is formed in the low concentration p-type layer 32.

A low concentration n-type base region 4 having a nitrogen doping concentration of $1 \times 10^{16}$ cm$^{-3}$, for example, is provided in the first and second regions, in direct contact with the low concentration n-type drift layer 2. The resistance component of the second region is small, making it possible to reduce the ON-resistance of the silicon carbide semiconductor apparatus. A low concentration gate region 11 is formed in the surface layer of a low concentration p-type well layer 3, between the base region 4 and the source region 5.

Via a gate insulation film 6, a gate electrode 7 is provided over the low concentration gate region 11 and the low concentration n-type base region 4. An interlayer insulation film 8 is provided on the gate electrode 7, and a source electrode 9 is formed on the interlayer insulation film 8 in low-resistance contact connection with the surfaces of the high concentration n$^+$ source region 5 and p-type well layer 3. A drain electrode 10 is formed on the backside of the high concentration n$^+$ substrate 1 having a low-resistance contact connection therewith. Also, the low concentration n-type base region 4 is provided with a cavity 41, as shown in FIG. 1.

To effect a low-resistance connection between the p-type well layer 3 and the source electrode 9, there may be cases where the high concentration p$^+$ layer 31 is formed on the surface of the p-type well layer 3, or the low concentration p-type layer 32 is etched to expose the surface of the high concentration p$^+$ layer 31 and connect the source electrode 9 directly to the exposed surface.

Figure 14:
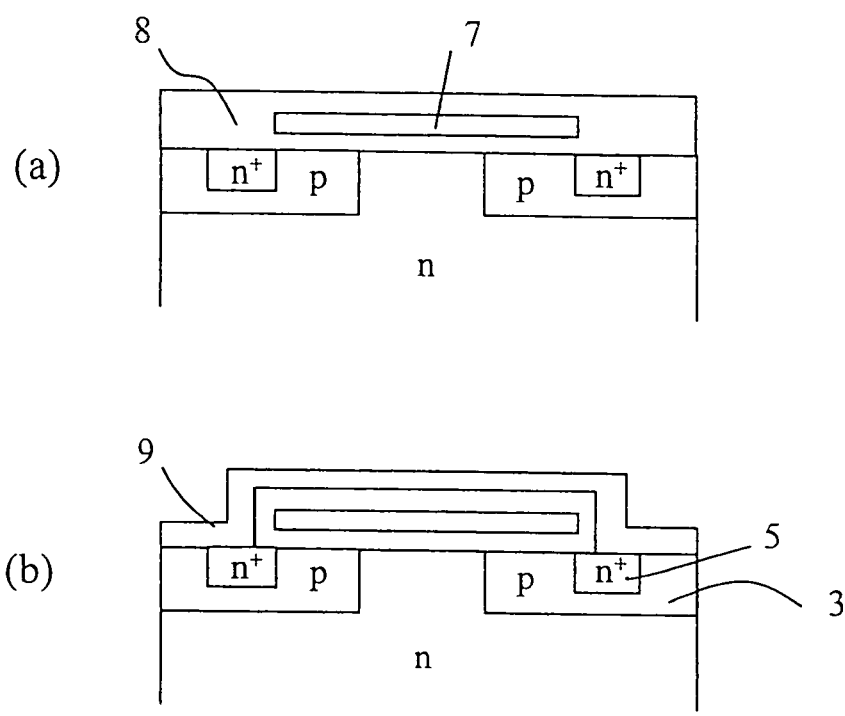
FIGS. 14(a) and 14(b) are drawings for explaining the method of manufacturing a silicon-based planar type vertical MOSFET by the double diffusion method.

The above silicon carbide vertical MOSFET operates basically in the same way as the conventional silicon carbide planar type vertical MOSFET shown in FIG. 14. That is, when a gate voltage that is a threshold voltage or higher is applied to the gate electrode 7, electrons are induced to the surface of the p-type well layer 3, forming a channel region 11 that establishes a state of electrical continuity between the high concentration n$^+$ source region 5 and the low concentration n-type drift layer 2, enabling electrons to flow from the drain electrode 10 to the source electrode 9.

What differs from the conventional MOSFET shown in FIG. 14 is that instead of the whole of the low concentration n-type drift layer 2 being covered by the high concentration p$^+$ layer 31 and the low concentration p-type layer 32 being formed on top of the layer 31, part of the surface of the low concentration n-type drift layer 2 is exposed, whereby a p-type deposition film having a concentration of $5 \times 10^{15}$ cm$^{-3}$ is connected directly to the n-type drift layer 2. That is, the whole of the region used to form the low concentration n-type base region 4 by the implantation of n-type impurity ions is composed of a low concentration p-type deposition film, so that following the implantation of the n-type impurity ions, the concentration of the portion 24 of the n-type base region 4 in contact with the n-type drift layer 2 is lowered. If the width of this portion 24 is 2 μm, for example, with the low concentration n-type base region 4 having the above concentration of $4 \times 10^{16}$ cm$^{-3}$, the pinch-off voltage will be 30 volts. Since in the case of this structure the concentration of the base region 4 is not more than $4 \times 10^{16}$ cm$^{-3}$, it is not necessary to use a high voltage to pinch off the base region 4.

Moreover, it also enables the blocking voltage of the junction between the base region 4 and the p-type well layer 3 to be improved, making it possible to realize a device that has high blocking voltages of 1000 volts or more. Also, because the gate region 11 is formed using a p-type deposition film having a low concentration of $2 \times 10^{16}$ cm$^{-3}$, high channel mobility in the order of several tens cm$^2$/VS is obtained, enabling the ON-resistance to be reduced.

Figure 2:
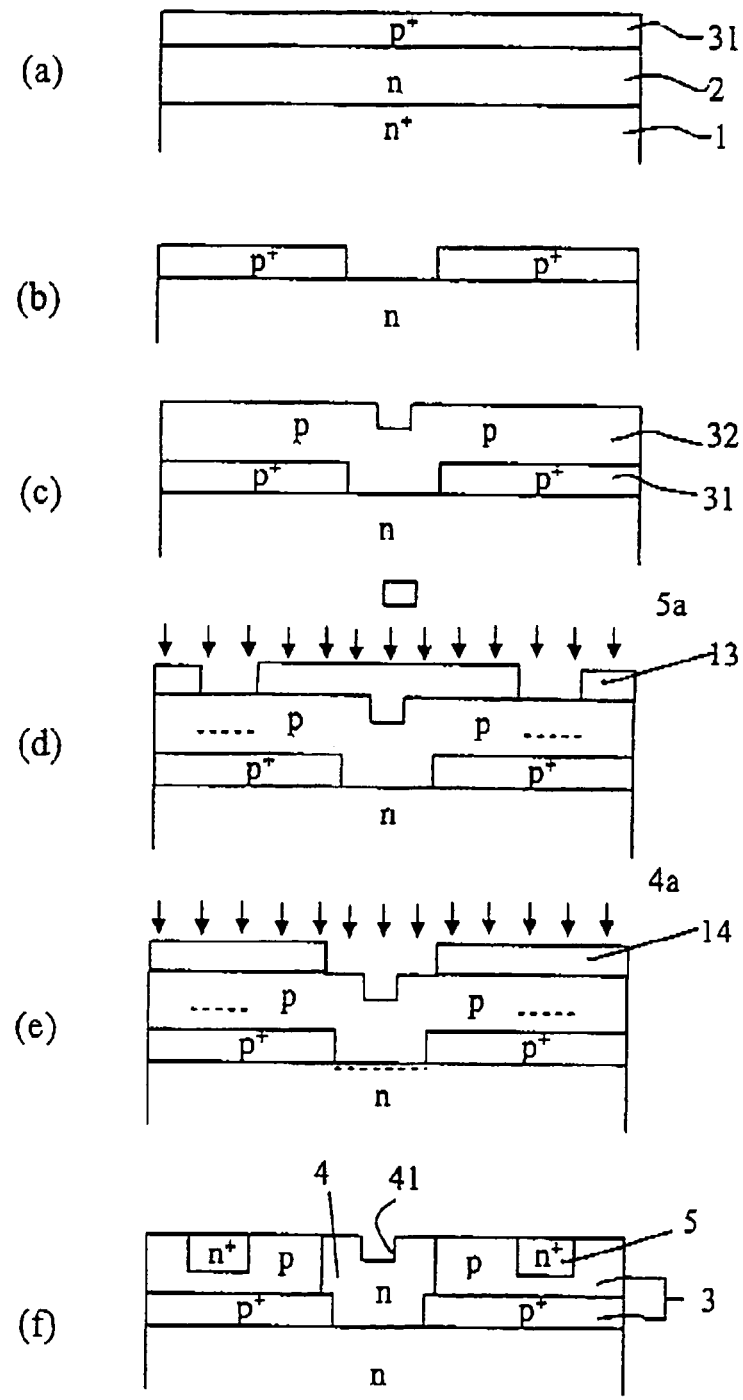
FIGS. 2(a) to 2(f) are schematic cross-sectional drawings for explaining the steps of manufacturing the silicon carbide vertical MOSFET of FIG. 1.

FIGS. 2(a) to 2(f) and FIGS. 3(a) to 3(d) are schematic cross-sectional drawings for explaining the steps of manufacturing the silicon carbide vertical MOSFET according to the first embodiment. In FIG. 2(a), the low concentration n-type drift layer 2 is deposited on the high concentration n⁺ substrate 1, and the high concentration p⁺ layer 31 is then deposited on the n-type drift layer 2. As an example, the drift layer 2 is 10 μm thick and is given a nitrogen doping concentration of $5 \times 10^{15}$ cm$^{-3}$, and the high concentration p⁺ layer 31 is 0.5 μm thick and is given an aluminum doping concentration of $2 \times 10^{18}$ cm$^{-3}$.

Next, as shown in FIG. 2(b), dry etching using a resist mask is used to form a trench structure that reaches from the surface to the low concentration n-type drift layer 2. A mixed gas of sulfur hexafluoride (SF$_6$) and oxygen (O$_2$) is used for the etching. After the resist is removed, the low concentration p-type layer 32 having, for example, an aluminum doping concentration of $5 \times 10^{15}$ cm$^{-3}$ and a thickness of 0.5 μm is formed on the above surface, as shown in FIG. 2(c).

Then, in order to form the high concentration n⁺ source region 5, as shown in FIG. 2(d), a mask 13 is formed on the surface of the low concentration p-type layer 32. The low concentration p-type layer 32 thus masked is then subjected to the implantation of n-type impurity ions 5a. The mask 13 is photolithographically patterned from a surface film of SiO$_2$ 1 μm thick formed by the reduced-pressure CVD method. As an example, the ion implantation 5a comprises the implantation of $2 \times 10^{20}$ cm$^{-3}$ phosphorus ions at multiple acceleration energies from 40 keV to 250 keV and at a substrate temperature of 500° C.

After removal of the mask 13, in order to form the low concentration n-type base region 4, as shown in FIG. 2(e), a mask 14 is used while n-type impurity ions 4a are implanted. The mask 14 is photolithographically patterned from a film of SiO$_2$ 1.5 μm thick formed on the surface of the layer 32 by the reduced-pressure CVD method. As an example, the impurity ions 4a are nitrogen ions implanted in the amount $2 \times 10^{18}$ cm$^{-3}$ at multiple acceleration energies from 40 keV to 400 keV, at room temperature. This is followed by 30 minutes of activation annealing at 1500° C. in an argon atmosphere, thereby forming the p-type well layer 3, the low concentration n-type base region 4 and the high concentration n⁺ type source region 5, as shown in FIG. 2(f).

Figure 3:
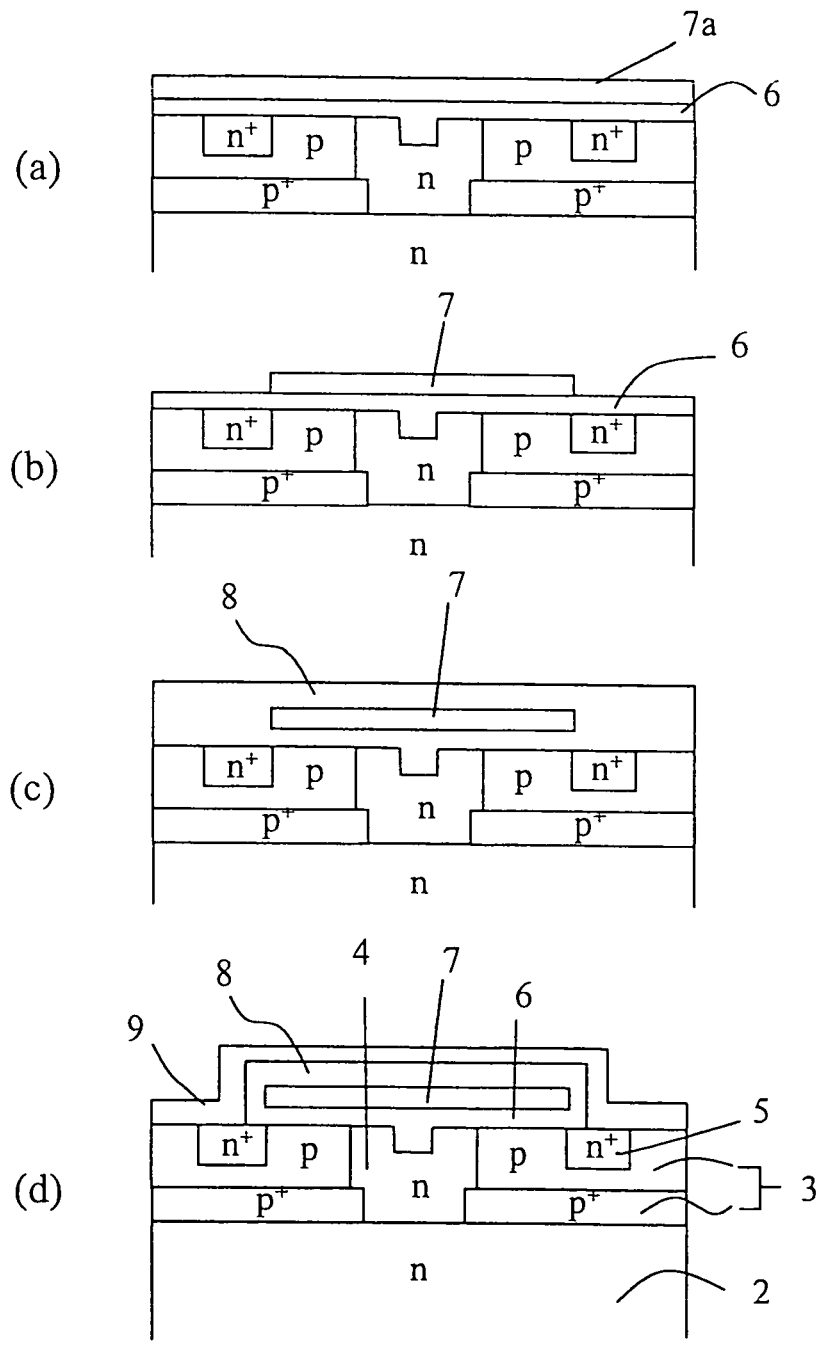
FIGS. 3(a) to 3(d) are schematic cross-sectional drawings for explaining the steps of manufacturing the silicon carbide vertical MOSFET of FIG. 1.

Next, the well layer 3, base region 4 and source region 5 are subjected to 140 minutes of thermal oxidation at 1200° C. to form a gate insulation film 6 having a thickness of 40 nm, as shown in FIG. 3(a). A layer of polycrystal silicon 7a 0.3 μm thick is then formed on the gate insulation film 6 by reduced-pressure CVD. Photolithography is then used to pattern the polycrystal silicon 7a to form the gate electrode 7 shown in FIG. 3(b), and reduced-pressure CVD is used to form the 05-μm-thick interlayer insulation film 8 on the gate electrode 7, as shown in FIG. 3(c). A window is formed in the interlayer insulation film 8 and a source electrode 9 is provided having a low-resistance connection to both the high concentration n⁺ source region 5 and the p-type well layer 3, as shown in FIG. 3(d).

While this embodiment has been described with reference to the structure of, and steps of manufacturing, a silicon carbide vertical MOSFET on a (0001) substrate surface, it is equally applicable to an (11-20) or (000-1) substrate surface. Even lower ON-resistance values were obtained with silicon carbide vertical MOSFETs manufactured on an (11-20) or (000-1) surface substrate, due to the fact that they have higher channel mobility than a (0001) surface substrate.

Figure 4:
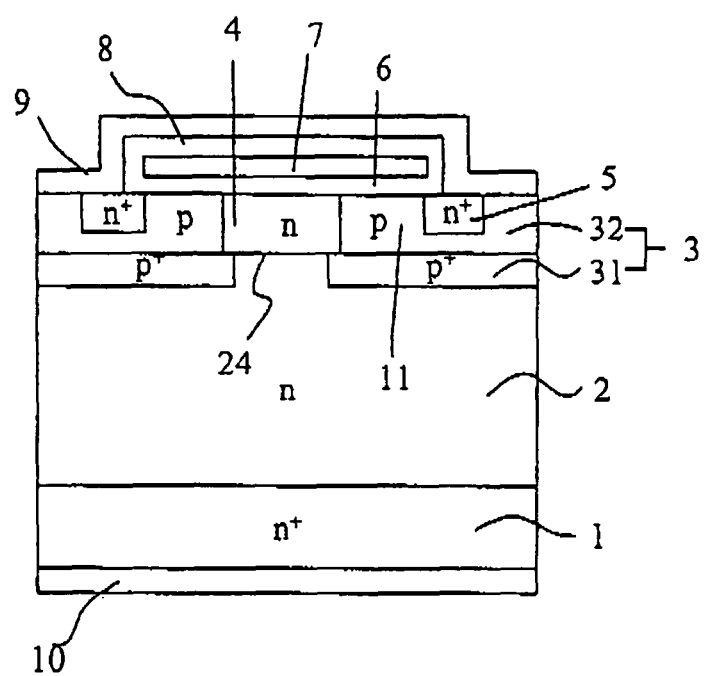
FIG. 4 is a schematic cross-sectional drawing for explaining a unit cell of a silicon carbide vertical MOSFET that is a second embodiment of the invention.

FIG. 4 is a schematic cross-sectional drawing for explaining the unit cell of a silicon carbide vertical MOSFET according to a second embodiment of the invention. With reference to FIG. 4, a low concentration n-type drift layer 2 having a thickness of 10 μm and a nitrogen doping concentration of $5 \times 10^{10}$ cm$^{-3}$ is deposited on the (0001) surface of a 300 μm-thick high concentration n⁺ substrate 1 having a nitrogen doping concentration of $5 \times 10^{18}$ cm$^{-3}$. Aluminum doping at a concentration of $2 \times 10^{18}$ cm$^{-3}$ is used to form a high concentration p⁺ layer 31 extending down to a depth of 0.5 μm from the surface of the low concentration n-type drift layer 2, and a 0.5-μm-thick low concentration p-type layer 32 having an aluminum doping concentration of $5 \times 10^{15}$ cm$^{-3}$ is deposited on the surface of the layer 31.

A high concentration n⁺ source region 5 that is selectively doped with phosphorus at a concentration of approximately $1 \times 10^{20}$ cm$^{-3}$ is formed in the surface portion of the low concentration p-type layer 32. The p⁺ layer 31 has a non-implanted portion that is not implanted with phosphorus ions. A low concentration n-type base region 4 doped with nitrogen at a concentration of $1 \times 10^{16}$ cm$^{-3}$ is provided in the non-implanted portion in direct contact with the low concentration n-type drift layer 2.

The low concentration gate region 11 is formed in the surface layer of the part of the p-type well layer 3 between the low concentration n-type base region 4 and the high concentration n⁺ source region 5. On the low concentration gate region 11 and on the surfaces of the low concentration n-type base region 4 and the high concentration n⁺ source region 5, a gate electrode 7 is provided via a gate insulation film 6. On the gate electrode 7, a source electrode 9 is provided via an interlayer insulation film 8, the source electrode 9 having a low-resistance connection with the surfaces of the high concentration n⁺ source region 5 and p-type well layer 3. A drain electrode 10 is formed on the backside of the high concentration n⁺ substrate 1 with a low-resistance connection.

Where this silicon carbide vertical MOSFET differs from that of the first embodiment shown in FIG. 1 is that the high concentration p⁺ layer 31 is deposited not on the surface of the low concentration n-type drift layer 2, but in the low concentration n-type drift layer 2. That is, the portion 24 of the low concentration n-type base region 4 in contact with the low concentration n-type drift layer 2 is located within the same plane as the upper edge of the high concentration p⁺ layer 31, and the region bounded by the high concentration p⁺ layer 31 is within the low concentration n-type drift layer 2. The concentration of the region bounded by the high concentration p⁺ layer 31 is therefore lower than in the structure of the first embodiment, making it possible to realize a device having higher blocking voltage than in the case of the first embodiment. As in the first embodiment, the low concentration n-type base region 4 provided in the low concentration p-type layer 32 is wider than in the high concentration p⁺ layer 31, reducing the resistance and decreasing the ON-resistance.

Figure 5:
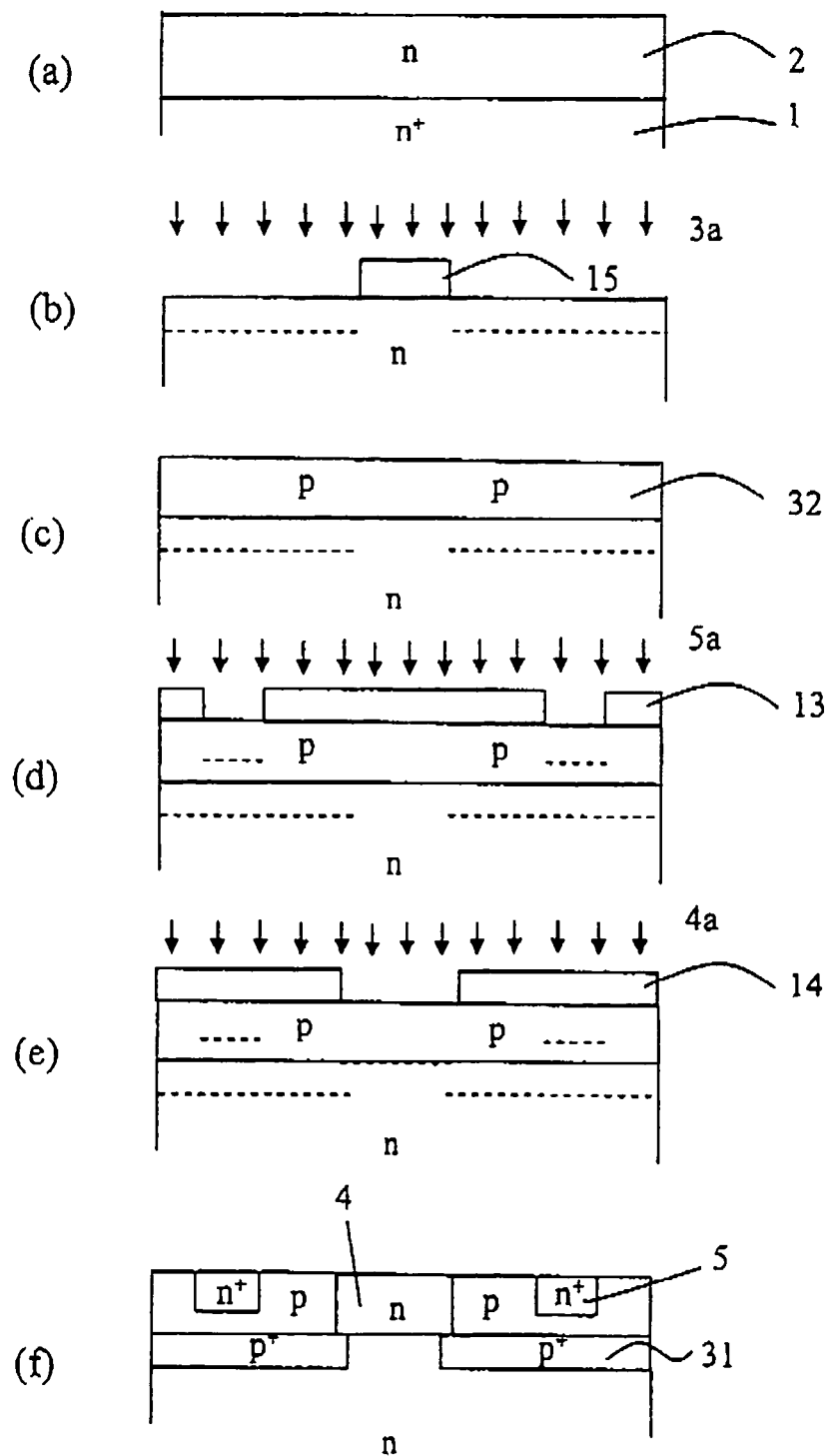
FIGS. 5(a) to 5(f) are schematic cross-sectional drawings for explaining the steps of manufacturing the silicon carbide vertical MOSFET of FIG. 4.

FIGS. 5(a) to 5(f) and FIGS. 6(a) to 6(d) are schematic cross-sectional drawings for explaining the steps of manufacturing the silicon carbide vertical MOSFET according to the second embodiment. In FIG. 5(a), the low concentration n-type drift layer 2 doped with nitrogen at a concentration of $5 \times 10^{15}$ cm$^{-3}$ is deposited to form a thickness of 10 μm on the high concentration n⁺ substrate 1. Then, mask 15 is formed on the low concentration n-type drift layer 2, as shown in FIG. 5(b), for the purpose of forming the high concentration p⁺ layer 31 by the implantation of p-type impurity ions 3a in the layer 2. The mask 15 can be formed using reduced-pressure CVD to form a film of SiO$_2$ 1 μm thick, and then using photolithography to pattern the film.

The p-type impurity ions 3a are aluminum ions implanted in the amount $2 \times 10^{18}$ cm$^{-3}$ at an acceleration energy ranging from 40 keV to 250 keV and at a substrate temperature of 500° C. As shown in FIG. 5(c), after the mask 15 has been removed, an 0.5-μm-thick low concentration p-type layer 32 doped with aluminum at a concentration of $5 \times 10^{15}$ cm$^{-2}$ is formed by deposition on the surface of the low concentration n-type drift layer 2.

Then, in order to form the high concentration n$^+$ source region 5, as shown in FIG. 5(d), a mask 13 is provided on the surface of the low concentration p-type layer 32, and the low concentration p-type layer 32 thus masked is subjected to the implantation of n-type impurity ions 5a. The n-type impurity ions 5a are phosphorus ions implanted in the amount $2 \times 10^{20}$ cm$^{-2}$ at an acceleration energy ranging from 40 keV to 250 keV and at a substrate temperature of 500° C. After the mask 13 has been removed, a mask 14 is formed for the forming of the low concentration n-type base region 4.

As shown in FIG. 5(e), the n-type impurity ions 4a are implanted into the low concentration p-type layer 32 thus masked. The n-type impurity ions 4a are nitrogen ions implanted in the amount $1 \times 10^{16}$ cm$^{-2}$ at acceleration energies ranging from 40 keV to 250 keV, at room temperature. The mask 14 is then removed, as shown in FIG. 5(f), which is followed by 30 minutes of activation annealing at 1500° C. in an argon atmosphere, thereby forming the p-type well layer 3, the low concentration n-type base region 4 and the high concentration n$^+$ source region 5. Next, the layers are thermally oxidized at 1200° C. for 140 minutes, forming a gate insulation film 6 having a thickness of 40 nm, and reduced-pressure CVD is used to form a deposition of polycrystal silicon 7a 0.3 μm thick, as shown in FIG. 6(a).

Figure 6:
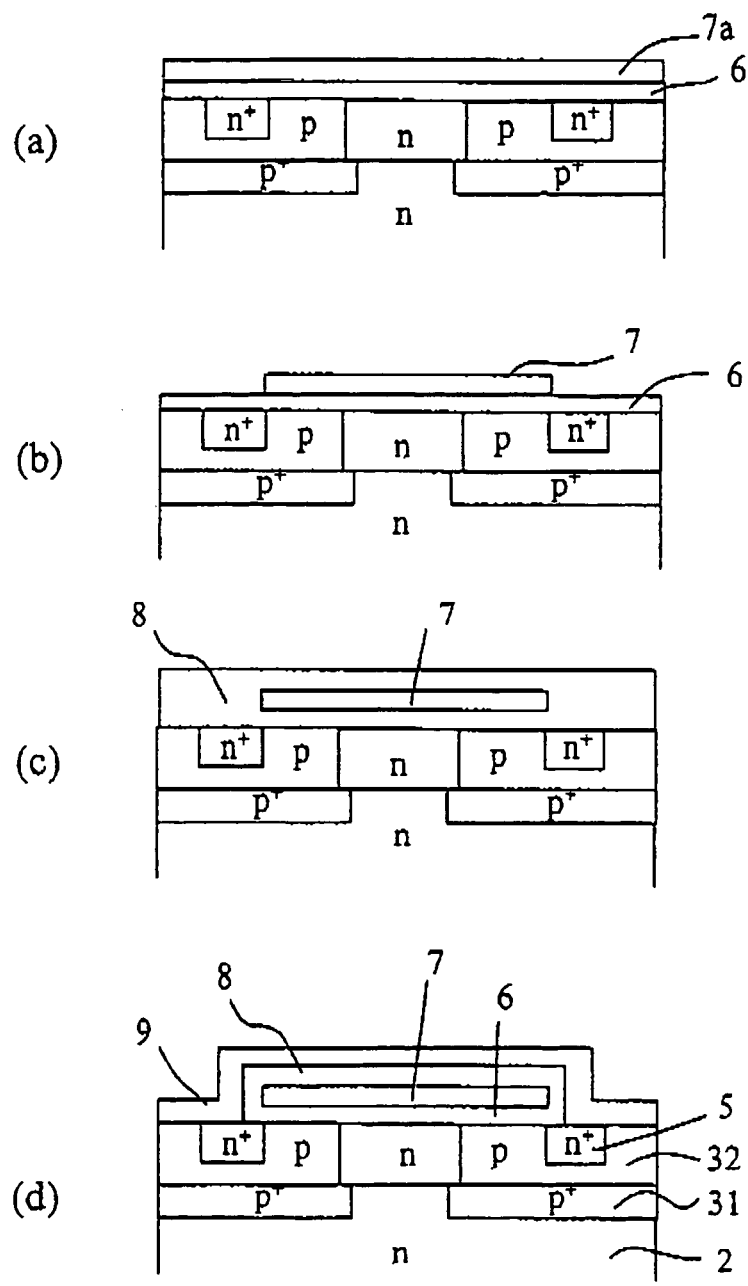
FIGS. 6(a) to 6(d) are schematic cross-sectional drawings for explaining the steps of manufacturing the silicon carbide vertical MOSFET of FIG. 4.

Photolithography is used to pattern the polycrystal silicon 7a to form the gate electrode 7, as shown in FIG. 6(b). Then, as shown by FIG. 6(c), an interlayer insulation film 8 having a thickness of 0.5 nm is deposited on the gate electrode 7 by the reduced-pressure CVD. A window is formed in the interlayer insulation film 8 and a source electrode 9 is provided having a low-resistance connection to both the high concentration n$^+$ source region 5 and the p-type well layer 3, as shown in FIG. 6(d).

While this second embodiment has been described with reference to the structure of, and steps of manufacturing, a silicon carbide vertical MOSFET on a (0001) substrate surface, it is equally applicable, with the same effect, to an (11-20) or (000-1) substrate surface.

FIG. 7 is a schematic cross-sectional drawing of a silicon carbide vertical MOSFET according to a third embodiment of the invention. In this third embodiment, parts that are the same as those in the first two embodiments are denoted by the same reference numbers. Except for the gate structure, the basic structure of the third embodiment is the same as that of the first embodiment. Where it differs from the first embodiment is that the gate insulation film 6 has a thicker portion of around 400 nm than the other parts of the gate insulation film 6. The structure of this gate insulation film 6 can be applied to that of the second embodiment, with the same effect.

Figure 8:
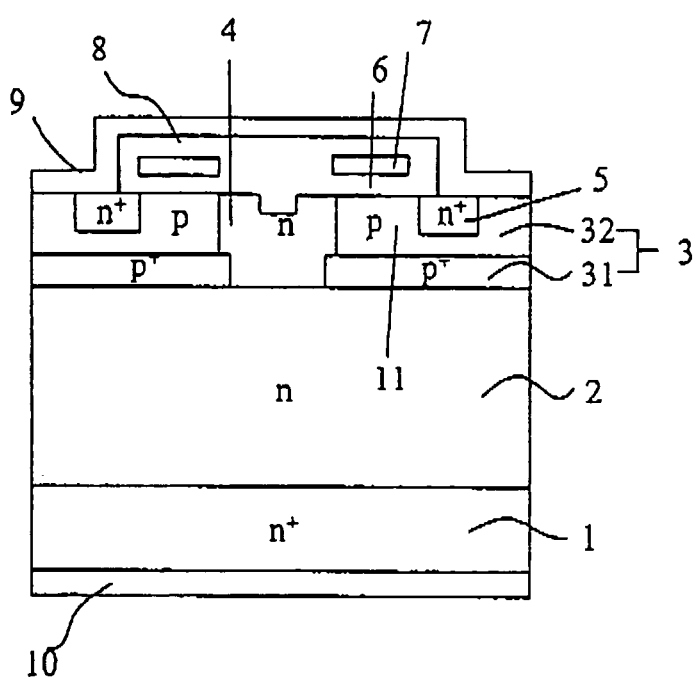
FIG. 8 is a schematic cross-sectional drawing for explaining a silicon carbide vertical MOSFET that is a fourth embodiment of the invention.

FIG. 8 is a schematic cross sectional drawing of a silicon carbide vertical MOSFET according to a fourth embodiment of the invention. In this fourth embodiment, parts that are the same as those in the first three embodiments are denoted by the same reference numbers. Except for the gate structure, the basic structure of the fourth embodiment is the same as that of the first embodiment shown in FIG. 1. Where it differs from the first embodiment is that the gate electrode 7 has a missing portion via which the interlayer insulation film 8 is deposited directly on the gate insulation film 6. The structure of this gate insulation film 6 can be applied to that of the second embodiment, with the same effect.

FIG. 9 is a schematic cross-sectional drawing of a silicon carbide vertical MOSFET according to a fifth embodiment of the invention. The fifth embodiment differs from the first embodiment shown in FIG. 1 in that it does not have a cavity 41 and does have a buried channel region 91 constituted as a low concentration n-type impurity region. The buried channel region 91 is, for example, a 0.2-μm-deep region of nitrogen ions having a concentration of $1 \times 10^{17}$ cm$^{-3}$. The operation of the fifth embodiment is more or less the same as that of the first embodiment. The fifth embodiment can also be applied with respect to the first four embodiments.

FIG. 10 is a schematic cross-sectional drawing of a silicon carbide vertical MOSFET according to a sixth embodiment of the invention. This sixth embodiment differs from the first five embodiments in that it has an insulation cover film 8' instead of an interlayer insulation film 8 and its source electrode 9' has a different configuration. Specifically, the source electrode 9' is not above the gate electrode 7, so the gate electrode 7 is covered by the insulation cover film 8' instead of via the interlayer insulation film 8. This structure of the sixth embodiment prevents electrical short-circuits between the gate electrode 7 and source electrode 9'.

Figure 11:
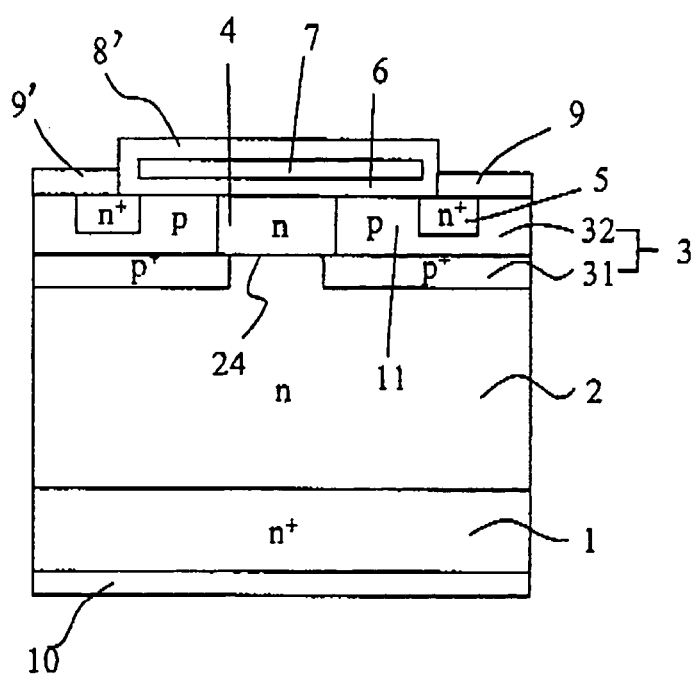
FIG. 11 is a schematic cross-sectional drawing for explaining a silicon carbide vertical MOSFET that is a seventh embodiment of the invention.
Figure 13:
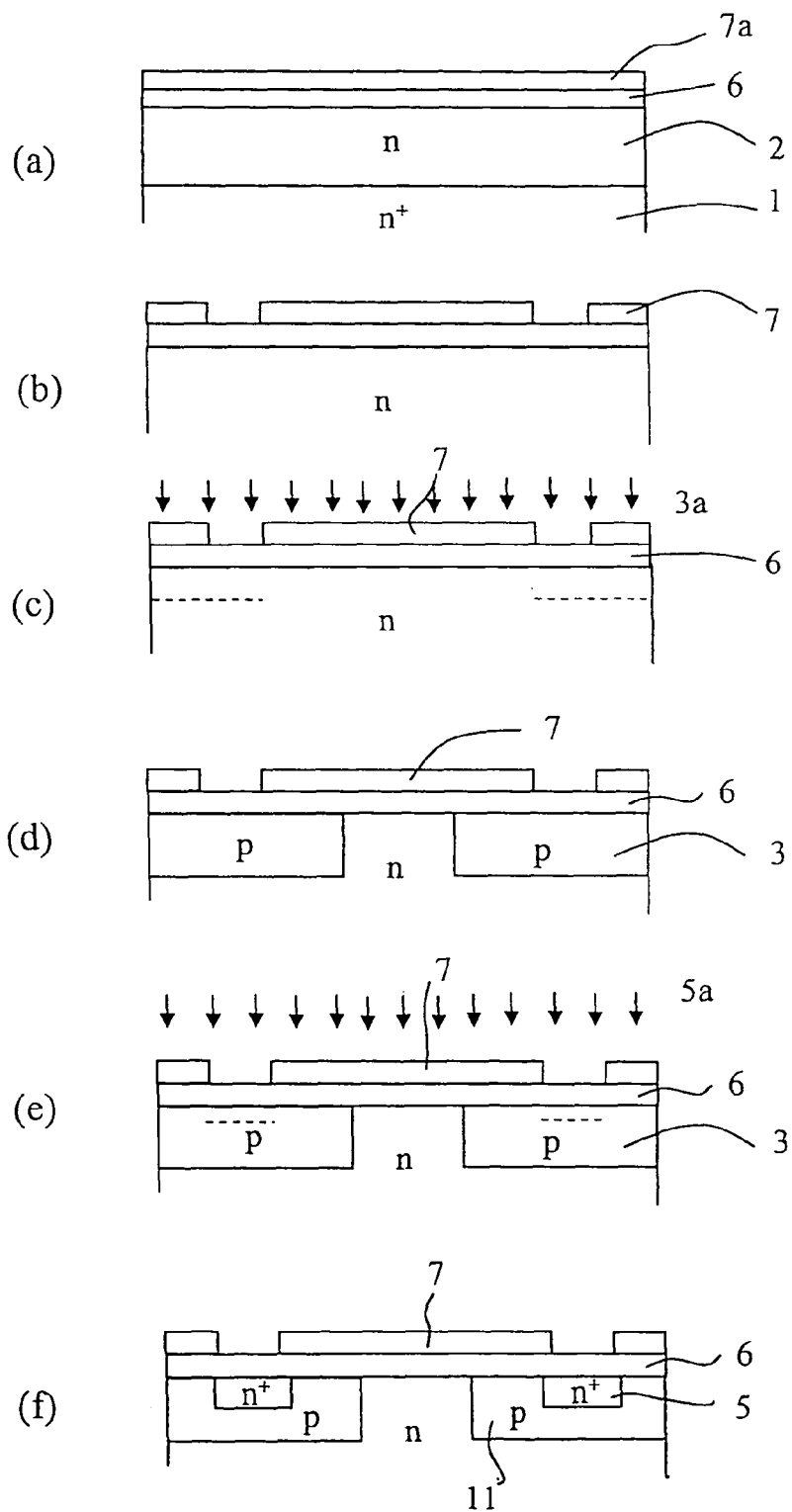
FIGS. 13(a) to 13(f) are drawings for explaining the method of manufacturing a silicon-based planar type vertical MOSFET by the double diffusion method.

FIG. 11 is a schematic cross-sectional drawing of a silicon carbide vertical MOSFET according to a seventh embodiment of the invention, which comprises the interlayer insulation film 8 and source electrode 9 of the second embodiment shown in FIG. 4, given the same configuration as in the sixth embodiment.

A more detailed explanation will now be given with respect to why the silicon carbide semiconductor apparatus of this invention provides improved channel mobility and lower ON-resistance, as well as high blocking voltage.

The surface concentration of the p-type layer forming the channel has to be reduced in order to raise the channel mobility, and the bottom of the p-type layer has to have a high concentration to increase the blocking voltage. This is done to enable the low concentration n-type layer between the bottoms of the high concentration p$^+$ layers to be pinched off with a low reverse bias, and to prevent punch through between the high concentration n$^+$ source region and the low concentration n-type drift layer.

In the case of conventional silicon carbide planar type vertical MOSFETs, the very low impurity-diffusion coefficient in the silicon carbide substrate makes it difficult to use the double diffusion method in the fabrication. Also, due to profile tailing off towards the surface when the double ion implantation method is used for the fabrication, giving the bottom part of the p-type layer a high concentration results in the surface also becoming high concentration, increasing the ON-resistance.

Figure 15:
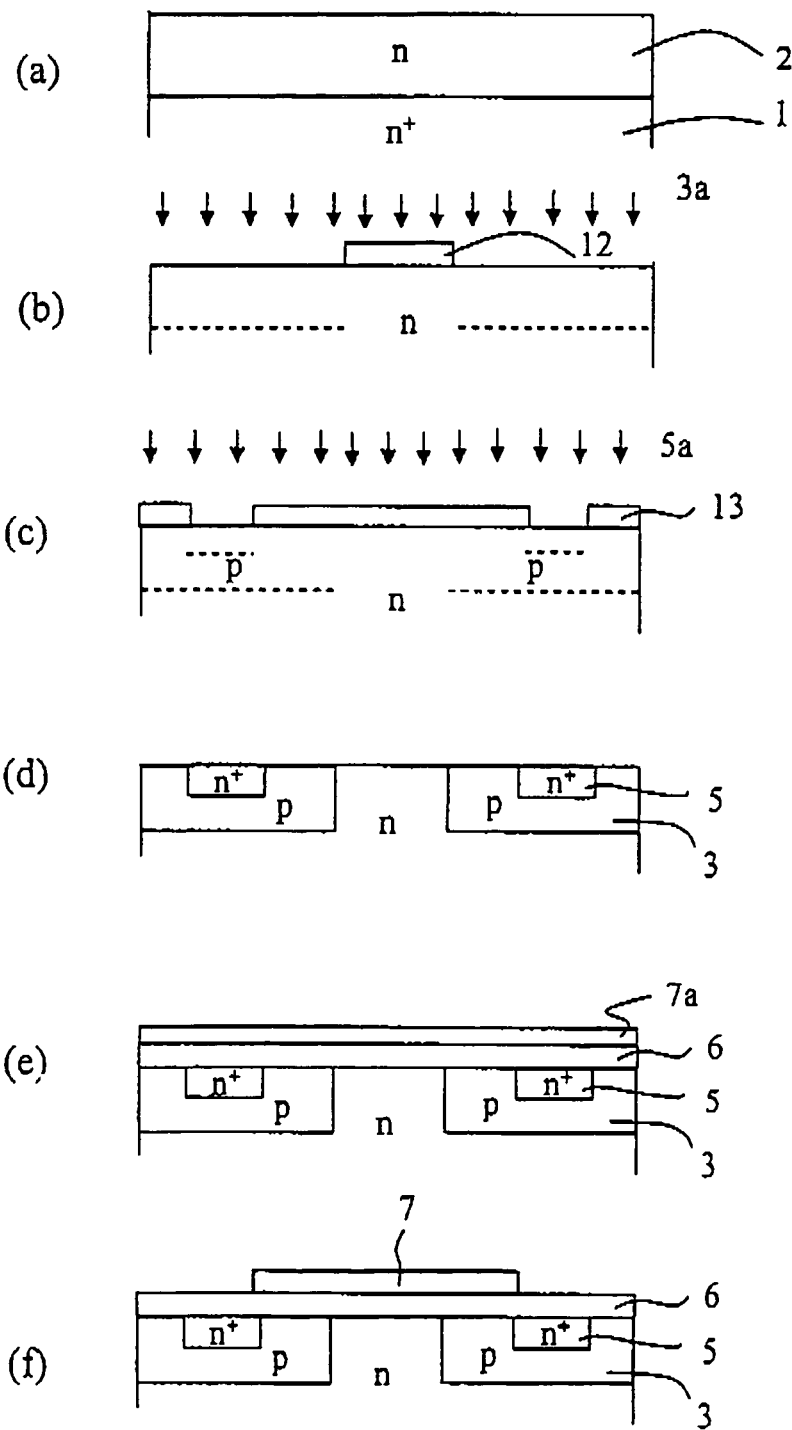
FIGS. 15(a) to 15(f) illustrate the method of manufacturing a typical conventional silicon carbide planar type vertical MOSFET using the double ion implantation method.
Figure 16:
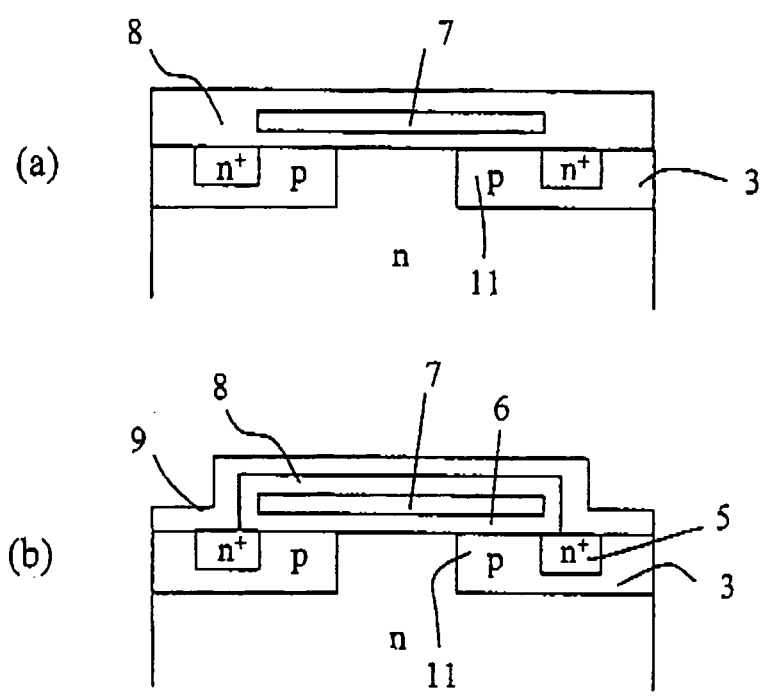
FIGS. 16(a) and 16(b) illustrate the method of manufacturing a typical conventional silicon carbide planar type vertical MOSFET using the double ion implantation method.
Figure 17:
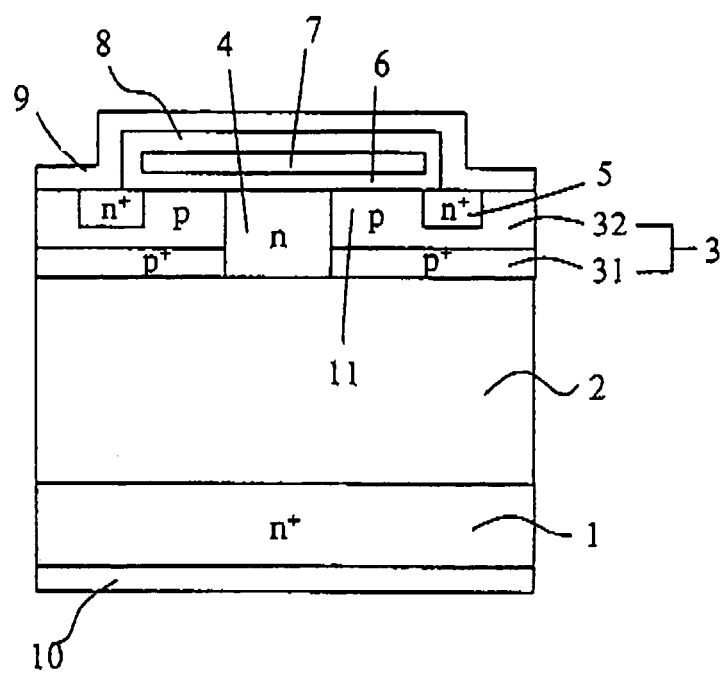
FIG. 17 is a schematic cross-sectional drawing for explaining the structure of a unit cell proposed for a silicon carbide planar type vertical MOSFET.

A low ON-resistance can be achieved when using the method shown in FIG. 15, but not high blocking voltage. In the silicon carbide vertical MOSFET of this invention, the low concentration of the n-type region bounded by the high concentration p$^+$ layer makes it possible to achieve both low ON-resistance and high blocking voltage.

The low concentration n-type base region is given a lower concentration than the high concentration p$^+$ channel region in order to keep down the drain voltage used to pinch off the low concentration n-type base region and provide high blocking voltage. In other words, it is done to increase the width of the depletion layer that extends into the low concentration n-type base region from the interface between the base region and the high concentration p$^+$ channel region. In the case of this invention, the presence of the selectively removed in the p+ channel region (non-implanted portion) enables the concentration of the n-type base region to be made lower than that of the p+ channel region.

In the foregoing, the present invention has thus been described with reference to specific embodiments. However, it should be noted that the present invention is in no way limited to the details of the described embodiments but that changes and modifications may be made to the extent that such changes and modifications do not depart from the scope of the appended claims. While the above descriptions have been made with reference to the strip-shaped silicon carbide semiconductor apparatus shown in cross section in the drawings, the apparatus may be another shape, such as in the form of a mesh, or hexagonal, or round, or modified versions thereof, without departing from the scope of the appended claims. In the same way, the configuration of removed regions, non-implanted portions, cavities and so forth may be changed to the extent that such changes do not change the effect of the invention.

INDUSTRIAL APPLICABILITY

The invention described in the foregoing provides the following effects.

The silicon carbide vertical MOSFET having a low concentration gate region formed in a low concentration p-type deposition layer, in accordance with this invention, can be manufactured with a low ON-resistance and a high blocking voltage. The high blocking voltage of the silicon carbide vertical MOSFET is achieved by making the impurity concentration of a base region of a first conductivity type lower than that of a gate layer of a second conductivity type. The lowering of the ON-resistance is made possible by optimizing the impurity concentration of a portion of a second conductivity type in contact with the gate insulation film of a gate region of a second conductivity type selectively formed in a deposition film.

Also a high blocking voltage is imparted to the silicon carbide vertical MOSFET by optimizing the impurity concentration of a portion of a first conductivity type in contact with the high concentration gate region of a second conductivity type in the low concentration base region having a first conductivity type selectively formed in the third deposition film.

By making the high concentration gate region of a second conductivity type a second deposition film formed of high concentration silicon carbide of a second conductivity type formed on the first deposition film, it is possible to reduce the impurity concentration of the gate region and of the portion in contact with the high concentration gate region of a second conductivity type in the low concentration base region of a first conductivity type.

Forming the high concentration gate region of a second conductivity type in the first deposition film also makes it possible to reduce the impurity concentration of the gate region and of the portion in contact with the high concentration gate region of a second conductivity type in the low concentration base region of a first conductivity type.

The ON-resistance is also be reduced without increasing the resistance in the vicinity of the interface between the gate insulation film and the low concentration base region of a first conductivity type, by selectively forming the gate insulation film on the third deposition film so that at least a portion thereof above the low concentration base region of a first conductivity type selectively formed in the second deposition film is thicker than the other parts of the region.

The ON-resistance is also be reduced without increasing the resistance in the vicinity of the interface between the gate insulation film and the low concentration base region of a first conductivity type, by omitting at least part of the gate electrode formed on the surface of the base region of a first conductivity type selectively formed in the third deposition film. Moreover, by using a substrate surface that is parallel to the (11-20) plane or (000-1) plane, the interface state density between the gate insulation film and the channel region is reduced, enabling a lower ON-resistance.

The present invention makes it possible to form a low concentration gate region and a low concentration base region of a first conductivity type, facilitating the manufacture of a silicon carbide vertical MOSFET having both a low ON-resistance and a high blocking voltage.

The crystal quality of the third deposition film deteriorates owing to the quality limit if the thickness is less than the lower limit of 0.2 reducing electron mobility. Difficulties in the fabrication processes also limit the upper thickness of the film. Specifically, as shown in FIGS. 2(e) and 2(f) and FIGS. 5(e) and 5(f), the second region of a first conductivity type is formed by implantation of dopant ions of a first conductivity type from the surface of the deposition layer of a second conductivity type (by the so-called implantation for reverse), and if the film exceeds the maximum thickness of 0.7 special ion implantation using very high energy is required, making it difficult to manufacture.

The upper limit for the impurity concentration of the upper deposition film is set at $5 \times 10^{15}$ cm$^{-3}$, because channel mobility in the inversion layer increases in inverse proportion to the concentration, so for high mobility, the impurity concentration has to be below $2 \times 10^{16}$ cm$^{-3}$, and more preferably should be below $5 \times 10^{15}$ cm$^{-3}$. The lower limit is set at $1 \times 10^{15}$ cm$^{-3}$ because in the fabrication process, it is very difficult to control concentration below that level. Also, since the amount of ions implanted for reverse can be decreased, the second region can be made a low concentration region which, by increasing the pinch-off effect, makes it easier to impart high blocking voltage to the device.

The invention claimed is:

1. A silicon carbide semiconductor device, comprising:
a lower deposition film which is formed of a single layer of silicon carbide of a first conductivity type, and which has lower impurity concentration than a high impurity concentration silicon carbide substrate of the first conductivity type and which is formed on a surface of the silicon carbide substrate;
a high impurity concentration gate region of a second conductivity type selectively formed across from an upper surface to an interior of the lower deposition film, the high impurity concentration gate region being adjacent to and in contact with a non-implanted portion that is an exposed part of the upper surface of the lower deposition film;
an upper deposition film formed on the lower deposition film in which the high impurity concentration gate region is formed, wherein the upper deposition film comprises:
a low impurity concentration gate region of the second conductivity type directly deposited on a surface of the high impurity concentration gate region of the second conductivity type and having a lower impurity concentration than the high impurity concentration gate region;
a high impurity concentration source region of the first conductivity type selectively formed on part of an upper surface of the low impurity concentration gate region of the second conductivity type and being more heavily doped than the low impurity concentration gate region of the second conductivity type; and a low impurity concentration base region of the first conductivity type directly on the non-implanted portion and having a greater width than the non-implanted portion, wherein the non-implanted portion is doped with nitrogen at a concentration of $5\times10^{15}$ cm$^{-3}$, and the low impurity concentration base region is doped with nitrogen at a concentration of $1\times10^{16}$ cm$^{-3}$;

wherein the high impurity concentration source region is not adjacent to the high impurity concentration gate region by the low impurity concentration gate region; and wherein the high impurity concentration gate region extends to directly contact the low impurity concentration base region; and further comprising:

a gate insulation film formed on at least a surface of the upper deposition film;

a gate electrode formed via the gate insulation film;

a drain electrode having a low-resistance contact connection with a backside of the silicon carbide substrate of the first conductivity type; and a source electrode having a low-resistance contact connection with part of the high impurity concentration source region of the first conductivity type and the low impurity concentration gate region of the second conductivity type.

2. A silicon carbide semiconductor device according to claim 1, wherein the upper deposition film has a thickness within a range of 0.2 μm to 0.7 μm and wherein the low impurity concentration gate region of the second conductivity type selectively formed in the upper deposition film has a portion that is in contact with the gate insulation film and has an impurity concentration higher than $1\times10^{15}$ cm$^{-3}$ and lower than $5\times10^{15}$ cm$^{-3}$.

3. A silicon carbide semiconductor device according to claim 1, wherein the low impurity concentration base region of the first conductivity type has a lower impurity concentration than the high impurity concentration gate region of the second conductivity type.

4. A silicon carbide semiconductor device according to claim 1, wherein the low impurity concentration gate region of the second conductivity type selectively formed in the upper deposition film has a portion that is in contact with the gate insulation film and has an impurity concentration of not higher than $2\times10^{16}$ cm$^{-3}$.

5. A silicon carbide semiconductor device according to claim 1, wherein the upper deposition film is constituted of silicon carbide.

6. A silicon carbide semiconductor device according to claim 1, wherein in terms of crystal Miller index the surface of the silicon carbide substrate of the first conductivity type is a plane that is parallel to a (11-20) plane.

7. A silicon carbide semiconductor device according to claim 1, wherein in terms of crystal Miller index the surface of the silicon carbide substrate of the first conductivity type is a plane that is parallel to a (000-1) plane.

8. A silicon carbide semiconductor device according to claim 1, wherein high impurity concentration gate regions including the high impurity concentration gate region of the second conductivity type are formed on both sides of the non-implanted portion so that the non-implanted portion will be formed in an intermediate part of the upper surface of the lower deposition film, low impurity concentration gate regions including the low impurity concentration gate region of the second conductivity type are respectively directly deposited on surfaces of the high impurity concentration gate regions of the second conductivity type on both sides of the base region of the first conductivity type, and source regions including the source region of the first conductivity type are respectively formed on parts of upper surfaces of the low impurity concentration gate regions of the second conductivity type on both sides of the base region of the first conductivity type.

* * * * *